United States Patent
Li

(10) Patent No.: US 12,211,970 B2
(45) Date of Patent: *Jan. 28, 2025

(54) MICRO LIGHT EMITTING DIODE WITH HIGH LIGHT EXTRACTION EFFICIENCY

(71) Applicant: Jade Bird Display (Shanghai) Limited, Shanghai (CN)

(72) Inventor: Qiming Li, Albuquerque, NM (US)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/117,468

(22) Filed: Mar. 5, 2023

(65) Prior Publication Data

US 2023/0207765 A1 Jun. 29, 2023

Related U.S. Application Data

(63) Continuation of application No. 17/156,268, filed on Jan. 22, 2021, now Pat. No. 11,621,383.

(Continued)

(51) Int. Cl.
*H01L 33/62* (2010.01)
*H01L 33/10* (2010.01)
(Continued)

(52) U.S. Cl.
CPC .............. *H01L 33/62* (2013.01); *H01L 33/10* (2013.01); *H01L 33/30* (2013.01); *H01L 33/385* (2013.01); *H01L 33/46* (2013.01); *H01L 25/0753* (2013.01)

(58) Field of Classification Search
None
See application file for complete search history.

(56) References Cited

U.S. PATENT DOCUMENTS

| 6,320,206 B1 | 11/2001 | Coman et al. |
| 6,420,199 B1 | 7/2002 | Coman et al. |

(Continued)

FOREIGN PATENT DOCUMENTS

| CN | 1267109 A | 9/2000 |
| CN | 102097424 A | 6/2011 |

(Continued)

OTHER PUBLICATIONS

The International Searching Authority, The International Search Report and the Written Opinion, PCT/US2021/014707, Hong Kong Beida Jade Bird Display Limited, dated Apr. 15, 2021, 7 pages.

(Continued)

*Primary Examiner* — Feifei Yeung Lopez
(74) *Attorney, Agent, or Firm* — Morgan, Lewis & Bockius LLP

(57) ABSTRACT

A micro light emitting diode (LED) having a high light extraction efficiency includes a bottom conductive layer, a light emitting layer on the bottom conductive layer, and a top conductive structure on the light emitting layer. The micro LED additionally includes a conductive side arm electrically connecting the sidewall of the light emitting layer with the bottom conductive layer, and a reflective bottom dielectric layer arranged under the light emitting layer and above the bottom conductive layer. In some embodiments, the micro LED further includes an ohmic contact between the top conductive structure and the light emitting layer that has a small area and is transparent, thereby increasing the light emergent area and improving the light extraction efficiency.

20 Claims, 12 Drawing Sheets

Related U.S. Application Data

(60) Provisional application No. 62/965,889, filed on Jan. 25, 2020.

(51) Int. Cl.
  H01L 33/30 (2010.01)
  H01L 33/38 (2010.01)
  H01L 33/46 (2010.01)
  H01L 25/075 (2006.01)

(56) References Cited

U.S. PATENT DOCUMENTS

| | | | |
|---|---|---|---|
| 6,894,317 | B2 | 5/2005 | Nakajo |
| 8,735,910 | B2 | 5/2014 | Kang et al. |
| 11,211,525 | B2 | 12/2021 | Rajan et al. |
| 11,621,383 | B2 * | 4/2023 | Li .................... H01L 33/30 |
| | | | 257/79 |
| 2004/0245540 | A1 * | 12/2004 | Hata ................ H01L 21/0254 |
| | | | 257/E21.127 |
| 2009/0039371 | A1 | 2/2009 | Kim et al. |
| 2010/0078670 | A1 | 4/2010 | Kim et al. |
| 2011/0193113 | A1 * | 8/2011 | Jeong ................ H01L 33/44 |
| | | | 257/E33.002 |
| 2012/0012884 | A1 * | 1/2012 | Muramoto .......... H01L 33/06 |
| | | | 257/E33.062 |
| 2012/0025244 | A1 | 2/2012 | Suh et al. |
| 2014/0159043 | A1 * | 6/2014 | Sakariya ........... H01L 25/0753 |
| | | | 438/34 |
| 2014/0367705 | A1 * | 12/2014 | Bibl .................. H01L 33/44 |
| | | | 438/27 |
| 2014/0367717 | A1 | 12/2014 | Freund et al. |
| 2015/0063387 | A1 | 3/2015 | Joseph et al. |
| 2016/0211415 | A1 | 7/2016 | Huang et al. |
| 2019/0088820 | A1 | 3/2019 | Danesh et al. |
| 2019/0355888 | A1 * | 11/2019 | Tsai ................. H01L 33/54 |

FOREIGN PATENT DOCUMENTS

| | | |
|---|---|---|
| CN | 104269473 A | 1/2015 |
| CN | 104538537 A | 4/2015 |
| JP | H04-249384 A | 9/1992 |
| JP | H09-129933 A | 5/1997 |
| JP | H10-163530 A | 6/1998 |
| JP | 2002-084001 A | 3/2002 |
| JP | 2002-094116 A | 3/2002 |
| JP | 2002-368275 A | 12/2002 |
| JP | 2006-108698 A | 4/2006 |
| JP | 2008-283096 A | 11/2008 |
| JP | 2018-506177 A | 3/2018 |
| JP | 2018-078279 A | 5/2018 |
| TW | 201115729 A1 | 5/2011 |
| WO | 2011/010235 A1 | 1/2011 |

OTHER PUBLICATIONS

Extended European Search Report dated Feb. 2, 2024 issued in European Patent Application No. 21744964.4.
Office Action dated Mar. 28, 2024 for corresponding Chinese Patent Application No. 202180010389.6.
Office Action dated May 16, 2024, issued in corresponding Japanese Patent Application No. 2022-541877.
Office Action issued in Taiwanese Patent Application No. 110102432 dated Jul. 12, 2024.
Office Action issued in Taiwanese Patent Application No. 110102433 dated Jul. 12, 2024.
Office Action with Search Report issued in Chinese Patent Application No. 202180010389.6 dated Aug. 14, 2024.

* cited by examiner

MICRO LIGHT EMITTING DIODE WITH HIGH LIGHT EXTRACTION EFFICIENCY

RELATED APPLICATION

This application is a continuation of U.S. patent application Ser. No. 17/156,268, filed on Jan. 22, 2021, entitled "MICRO LIGHT EMITTING DIODE WITH HIGH LIGHT EXTRACTION EFFICIENCY," which claims priority to United States Provisional Patent Application No. 62/965,889, filed Jan. 25, 2020, entitled "MICRO LIGHT EMITTING DIODE WITH HIGH LIGHT EXTRACTION EFFICIENCY," all of which are hereby incorporated by reference.

TECHNICAL FIELD

The present disclosure relates generally to display devices, and more particularly, to systems and fabrication methods for micro light emitting diodes (LEDs) having high light extraction efficiency.

BACKGROUND

Display technologies are becoming increasingly popular in today's commercial electronic devices. These display panels are widely used in stationary large screens such as liquid crystal display televisions (LCD TVs) and organic light emitting diode televisions (OLED TVs) as well as portable electronic devices such as laptop personal computers, smartphones, tablets and wearable electronic devices. With the development of Mini LED and Micro LED technology in recent years, consumer devices and applications such as augmented reality (AR), projection, heads-up display (HUD), mobile device displays, wearable device displays, and automotive displays, require LED panels with improved efficiency and resolution. For example, an AR display integrated within a goggle and positioned close to a wearer's eyes can have a dimension of a fingernail while still demanding an HD definition (1280×720 pixels) or higher.

Light emitting diode (LED) is a junction luminescent device, and the main structure of LED is a P-N junction. Under a forward bias, the P-N junction emits visual light or infrared light. The emission efficiency of the LED is dependent on the epitaxy material, the ohmic contact electrode, the chip structure, the geometric shape, and so on.

In the current technology for LED, the formation of the P-type LED poses a big challenge. For example, there is difficulty in doping P-GaN LED due to the lack of high work function metal matched with the P-GaN. Additionally, a low ohmic contact resistance is required by controlling the annealing temperature, time, and atmosphere, etc. The electrode is required to be transparent to ensure the transmittance of the light from the LED. Generally, Au/Ni alloy is needed for forming a good ohmic contact. Au is not transparent to the emitted wavelengths, which causes the metal electrode to shield the emergent light rays. Therefore, the electrode cannot be too thick. However, when the electrode is too thin, the thin layer of electrode can cause the non-uniform diffusion of the current, which in turn would cause an overheating in the local area and a decrease in the transparency of the electrode.

A number of developments for LED displays are directed to improve the efficiency of the LED. For example, a flip-chip LED structure is implemented by turning an LED structure face down and bonding the flipped over LED structure with a substrate having electrodes. The flip-chip LED structure has more advantages on efficiency and technical maturity compared with other structures, because the flip-chip LED structure can reduce the photons absorbed by the P-type ohmic contact electrode, and can avoid the emitting light shielding by the electrode. Although the flip-chip LEDs have been extensively studied, the limitation of the total reflection effect has not been overcome yet, which limits the improving of the light extraction efficiency.

Although the Bragg mirror is conventionally used to improve the reflectivity, the Bragg mirror only has a high reflectance for the normal incident light. The Bragg mirror has a low reflectance for the oblique incident light. In that situation, a total reflection can not be achieved.

Furthermore, when a back reflective structure is added in the flip-chip LED structure, the contact area between the metal electrode and the semiconductor material is decreased, thereby causing the ohmic contact resistance dramatically increasing. The back contact formed in the back reflective structure reduces the reflective area of the back reflective structure, which in turn decreases the reflectivity of the reflective structure and the light extraction efficiency of the LED.

In addition, in the flip-chip LED structure, a low work function metal is needed for the electrode to achieve the N-GaN ohmic contact. Since the area left after the etching process is limited, it is very difficult to prepare the N-type ohmic contact.

SUMMARY

There is a need for improved LED designs that improve upon, and help to address the shortcomings of conventional LED systems and structures, such as those described above. In particular, there is a need for display panels with high efficiency micro LED structures which have a good ohmic contact, a high extraction area, a high reflectivity, and a high extraction efficiency.

Various embodiments include a display panel includes an array of pixel light sources (e.g., LEDs, OLEDs) electrically coupled to corresponding pixel driver circuits (e.g., FETs).

In some embodiments, a micro light emitting diode having a high light extraction efficiency includes: a bottom conductive layer; a light emitting layer on the bottom conductive layer; a top conductive structure on the light emitting layer; a bottom dielectric layer positioned between the bottom conductive layer and the light emitting layer; and a conductive side arm connecting a sidewall of a bottom layer of the light emitting layer and the bottom conductive layer.

In some embodiments, the micro light emitting diode, further includes: an ohmic contact layer positioned between the top conductive structure and the light emitting layer.

In some embodiments, the lateral width of the ohmic contact layer is much narrower than that of the light emitting layer.

In some embodiments, the top conductive structure directly covers the ohmic contact layer and a substantial portion of the light emitting layer is unshielded by the ohmic contact layer.

In some embodiments, the ohmic contact layer is a metal film.

In some embodiments, the thickness of the ohmic contact layer is less than 20 nm, and the lateral width of the ohmic contact layer is less than 0.5 μm.

In some embodiments, the material of the ohmic contact layer includes at least one or more selected from of the group consisting of group I, group II, group III, group IV, group VI, and group VIII of metals from a periodic table.

In some embodiments, the top conductive structure is transparent and the ohmic contact layer is transparent.

In some embodiments, the bottom dielectric layer is a composite reflective layer.

In some embodiments, the composite reflective layer includes multiple layers comprising at least an insulating reflective dielectric layer and a composite metal reflective layer, and the composite metal reflective layer is positioned at bottom of the insulating reflective dielectric layer and contacts the bottom conductive layer.

In some embodiments, the composite metal reflective layer has multiple layers.

In some embodiments, the insulating reflective dielectric layer further comprises a top insulating dielectric layer and a bottom Bragg mirror.

In some embodiments, the top insulating dielectric layer has no less than three layers.

In some embodiments, the material of the top insulating dielectric layer is metal oxide.

In some embodiments, the lateral width of the bottom conductive layer is larger than that of the bottom dielectric layer, so that the bottom conductive layer has a protruded top extending outside of the bottom dielectric layer; and one end of the conductive side arm is connected to a bottom layer of the light emitting layer and at least part of another end of the conductive side arm is connected to and supported on the protruded top of the bottom conductive layer.

In some embodiments, the lateral width of the bottom dielectric layer is not less than width of bottom of the light emitting layer.

In some embodiments, the light emitting layer further includes a first type of semiconductor layer, an active layer and a second type of semiconductor layer in turn from top down. In some embodiments, the second type of semiconductor layer has a protruded top extending outside of the active layer and the first type of semiconductor layer, and an end of the conductive side arm covers and contacts the protruded top of the second type of semiconductor layer, and another end of the conductive side arm contacts the bottom conductive layer.

In some embodiments, the lateral width of the bottom conductive layer is larger than that of the second type of semiconductor layer and that of the bottom dielectric layer, so that the bottom conductive layer has a protruded top extending outside of the second type of semiconductor layer and the bottom dielectric layer. In some embodiments, at least part of the conductive side arm is supported on the protruded top of the bottom conductive layer.

In some embodiments, the lateral width of the bottom conductive layer is less than 2 μm.

In some embodiments, the width of the protruded top of the bottom conductive layer is not more than width of the protruded top of the second type of semiconductor layer.

In some embodiments, the second type of semiconductor layer further comprises a second type of top semiconductor layer and a second type of bottom semiconductor layer, and the second type of bottom semiconductor layer extends outside relative to the second type of top semiconductor layer, thereby forming a protruded top.

In some embodiments, the material of the second type of top semiconductor layer is different from that of the second type of bottom semiconductor layer.

In some embodiments, the second type of top semiconductor layer is AlGaInP and the second type of bottom semiconductor layer is GaP; and the first type of semiconductor layer is AlInP.

In some embodiments, the end of the conductive side arm: is in electrical contact with the protruded top of the second type of bottom semiconductor layer, is not in electrical contact with the second type of top semiconductor layer, and is not in electrical contact with the light emitting layer and the first type of semiconductor layer.

In some embodiments, the lateral width of the first type of semiconductor layer is equal to or larger than that of the active layer.

In some embodiments, the lateral width of the first type of semiconductor layer is much narrower than that of the active layer.

In some embodiments, the conductive side arm has an inverted L shape.

In some embodiments, the conductive side arm is attached and connected to a sidewall of the bottom dielectric layer.

In some embodiments, the lateral width of the bottom conductive layer is larger than that of the bottom dielectric layer, and a sidewall of the bottom conductive layer protrudes outside and beyond a sidewall of the conductive side arm.

In some embodiments, the micro light emitting diode, further includes: a transparent isolation layer, which at least covers the protruded top of the second type of semiconductor layer, a top and a side wall of the conductive side arm, a sidewall of the light emitting layer, and a sidewall of the first type of semiconductor layer, and the top conductive structure is positioned on top of the transparent isolation layer.

In some embodiments, the material of the conductive side arm is conductive metal.

In some embodiments, the first type of semiconductor layer is an N type semiconductor layer and the second type of semiconductor layer is a P type semiconductor layer.

In some embodiments, the first type of semiconductor layer is a P type semiconductor layer and the second type of semiconductor layer is an N type semiconductor layer.

In some embodiments, the material of the bottom conductive layer includes one or more types of conductive metal.

In some embodiments, the micro light emitting diode, further includes an electric circuit base at bottom of the bottom conductive layer, wherein the bottom conductive layer is used as a bonding layer that is bonded with a surface of the electric circuit base.

In some embodiments, the electric circuit base at least includes a driving circuit that controls emission of the light emitting layer.

In some embodiments, the micro light emitting diode has a light extraction efficiency of at least 20%.

In some embodiments, the micro light emitting diode has a light extraction efficiency of at least 40%.

In some embodiments, the micro light emitting diode has a light extraction efficiency of at least 60%.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1:
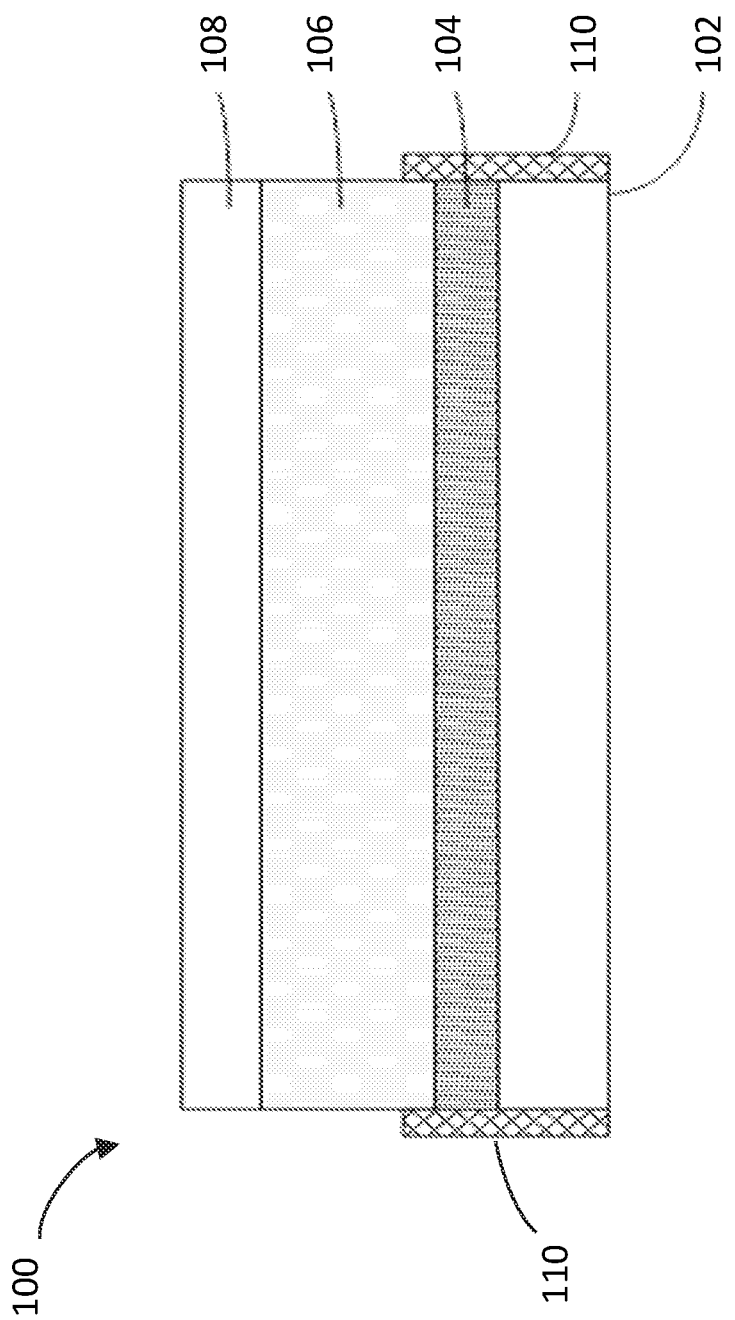
FIG. 1 is a cross-sectional view of a micro LED structure, according to a first embodiment.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein. Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Embodiments consistent with the disclosure include a display panel, including a substrate with an array of pixel driver circuits, an array of LEDs with structures described below, formed over the substrate, and methods of making the display panel. The display panels having a high light extraction efficiency are capable of overcoming the drawbacks of the conventional display systems.

FIG. 1 is a cross-sectional view of a micro LED structure, according to a first embodiment. The micro LED structure 100 illustrated in FIG. 1 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the micro LED includes a bottom conductive layer 102, a light emitting layer 106 on the bottom conductive layer 102, and a top conductive structure 108 on the light emitting layer 106. In some embodiments, the micro LED further comprises a bottom dielectric layer 104 arranged between the bottom conductive layer 102 and the light emitting layer 106. In some embodiments, bottom dielectric layer 104 is a part of the light emitting layer 106. In some embodiments, the light emitting layer 106 includes many different layers. In some embodiments, a conductive side arm 110 connects the sidewall of a bottom layer or bottom portion (not shown separately in FIG. 1) of the light emitting layer 106 and the bottom conductive layer 102. In some embodiments, the conductive side arms 110 are on both sides of the micro LED structure. In some embodiments, the top conductive structure 108 forms a top conductive structure, which is not limited by the scope of this embodiment. In some embodiments, the shape of the top conductive structure is a line, a square, a rectangle, or some other shapes.

Figure 2:
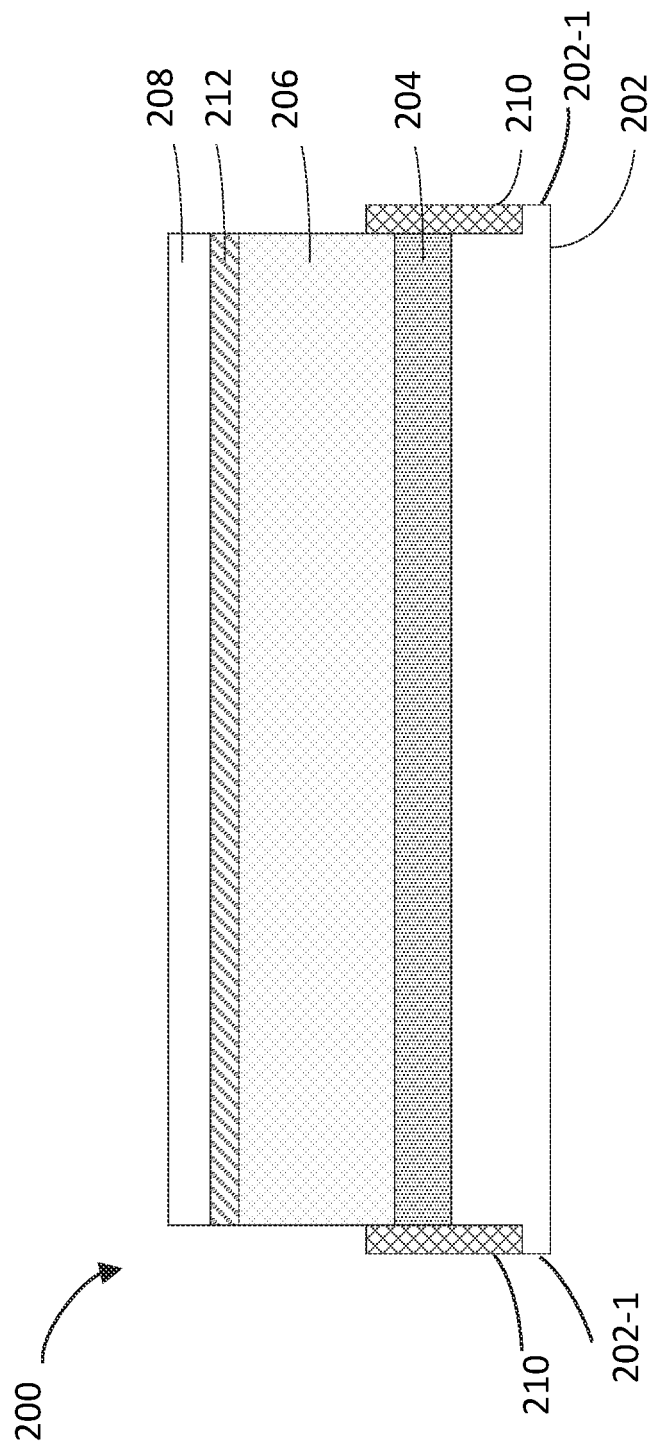
FIG. 2 is a cross-sectional view of a micro LED structure, according to a second embodiment.

FIG. 2 is a cross-sectional view of a micro LED structure, according to a second embodiment. The micro LED structure 200 illustrated in FIG. 2 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the micro LED structure 200 in FIG. 2 is based on the micro LED structure 100 of FIG. 1. Similar to the micro LED structure 100 in FIG. 1, the micro LED structure 200 includes a bottom conductive layer 202, a light emitting layer 206, a bottom dielectric layer 204, a top conductive structure 208, and a conductive side arm 210. In addition, in some embodiments, the bottom conductive layer 202 connected to the conductive side arm 210 has a protruded bottom 202-1, so that the bottom of the conductive side arm 210 is at least partially or alternatively completely supported by the protruded bottom 202-1 of the bottom conductive layer 202. In one example, the sidewall of the conductive side arm 210 is aligned with the sidewall of the protruded bottom 202-1 of the bottom conductive layer 202 as shown in FIG. 2. Furthermore, in some embodiments, an ohmic contact layer 212 is placed between the top conductive structure 208 and the light emitting layer 206. In some embodiments, the ohmic contact layer 212 is a metal film. The component of the metal film of the ohmic contact layer 212 is at least selected from one or more of the group I, group II, group III, group IV, group VI, and group VIII in the periodic table, and combinations thereof, such as Au, Cr, Be, Zn, Pt, Ti, Ge, Ni, In, and combinations thereof. In some embodiments, when the light emits from the top of the LED 200, a transparent top conductive structure to the emitted light is used as the top conductive structure 208, such as an Indium tin oxide (ITO) transparent conductive film. In some embodiments, the ohmic contact layer 212 is transparent to the emitted light. Preferably, when the thickness of the ohmic contact layer 212 is less than 20 nm, the ohmic contact layer 212 can be transparent to the emitted light.

Figure 3:
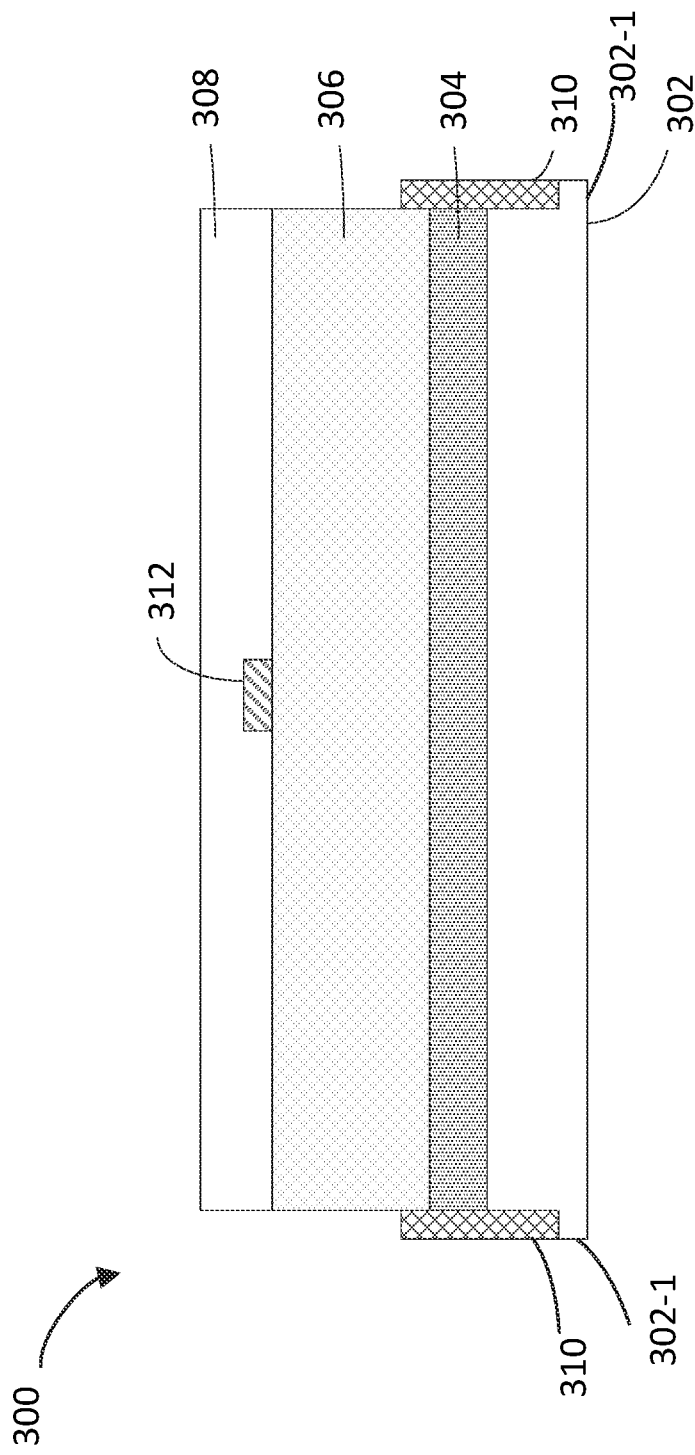
FIG. 3 is a cross-sectional view of a micro LED structure, according to a third embodiment.

FIG. 3 is a cross-sectional view of a micro LED structure, according to a third embodiment. The micro LED structure 300 illustrated in FIG. 3 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the micro LED structure 300 in FIG. 3 is based on the micro LED structure 200 of FIG. 2. Similar to the micro LED structure 200 in FIG. 2, the micro LED structure 300 includes a bottom conductive layer 302, a light emitting layer 306, a bottom dielectric layer 304, and a top conductive structure 308, a conductive side arm 310, a protruded bottom 302-1 of the bottom conductive layer 302 underneath the conductive side arm 310, and an ohmic contact layer 312. In some embodiments, the width of the ohmic contact layer 312 is much narrower than that of the light emitting layer 306, so as to form an ohmic contact point. The top conductive structure 308 covers the ohmic contact layer 312 and the light emitting layer 306 is not completely shielded by the ohmic contact layer 312. In some embodiments, to improve light extraction efficiency, the lateral width of the ohmic contact layer 312 is less than 1 μm, preferably, less than 0.5 μm. In some embodiments, to improve light transmittance of the ohmic contact layer 312, the thickness of the ohmic contact layer 312 is less than 20 nm. In some embodiments, the material of the ohmic contact layer 312 is dependent on the type of light emitting layer 306 and the material of the top conductive structure 308. In some embodiments, the material of the ohmic contact layer 312 is metal. In some preferred embodiments, the ohmic contact layer 312 has multiple layers formed by composite metal materials such as the materials used by the ohmic contact layer 212 in FIG. 2.

Figure 4:
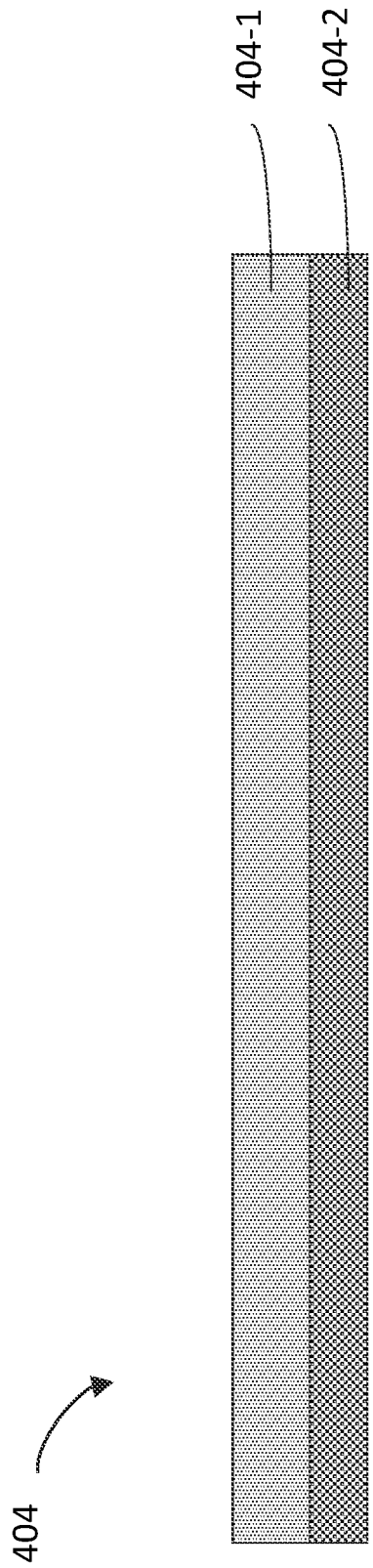
FIG. 4 depicts a cross-sectional view of a structure of a bottom dielectric layer of a micro LED structure, according to some embodiments.

FIG. 4 depicts a cross-sectional view of a structure of a bottom dielectric layer of a micro LED structure, according to some embodiments. The bottom dielectric layer 404 can be used as the bottom dielectric layer in FIGS. 1 to 3. The bottom dielectric layer 404 has a reflectivity. In some embodiments, the bottom dielectric layer 404 has a more than 50% of reflectance. In some embodiments, the bottom dielectric layer 404 has a more than 70% of reflectance. In some embodiments, the bottom dielectric layer 404 has a more than 90% of reflectance. In some preferred embodiments, the bottom dielectric layer 404 is a composite reflective layer, which increases the reflective area and improves the reflective efficiency. As shown in FIG. 4, the composite reflective layer 404 has multiple layers which at least includes an insulating reflective dielectric layer 404-1 and a composite metal reflective layer 404-2. In some embodiments, the composite metal reflective layer 404-2 is arranged at the bottom of the insulating reflective dielectric layer 404-1. In some embodiments, the composite metal reflective layer 404-2 contacts the bottom conductive layer which is shown in FIGS. 1 to 3. In some embodiments, the material of the composite metal reflective layer 404-2 is similar or same as that of the bottom conductive layer, such as Cr, and/or Au, etc., which is used not only as a reflective layer, but also as a buffering layer between the insulating reflective dielectric layer 404-1 and the bottom conductive layer. The composite metal reflective layer 404-2 further increases the adhesive force between the insulating reflective dielectric layer 404-1 and the bottom conductive layer, so that the insulating reflective dielectric layer 404-1 and the bottom conductive layer are firmly bonded together.

Figure 5:
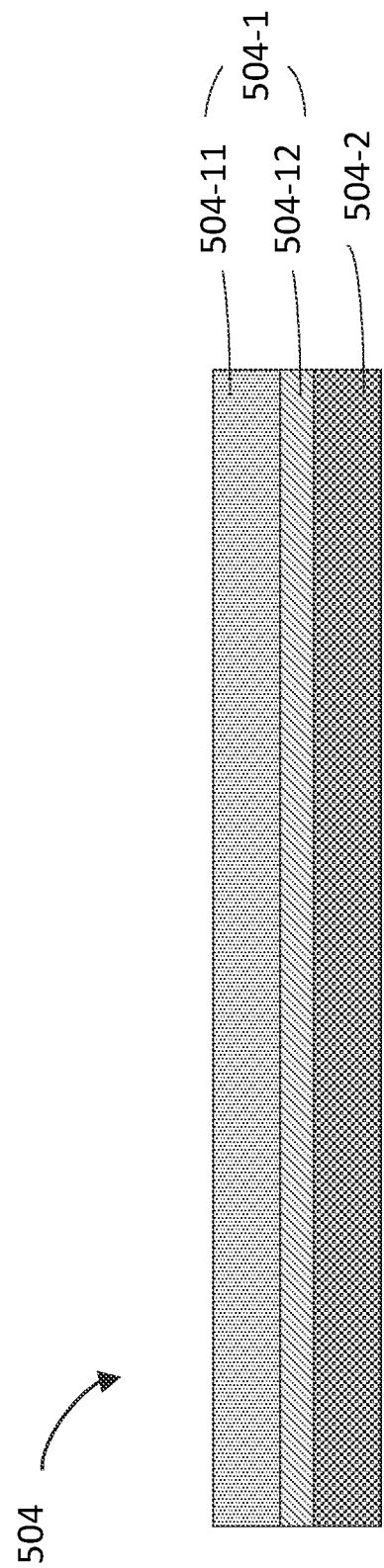
FIG. 5 depicts a cross-sectional view of a structure of a bottom dielectric layer of a micro LED structure, according to some embodiments.

FIG. 5 depicts a cross-sectional view of a structure of a bottom dielectric layer of a micro LED structure, according to some embodiments. The bottom dielectric layer 504 can be used as the bottom dielectric layer in FIGS. 1 to 4. In some embodiments, the bottom dielectric layer 504 includes an insulating reflective dielectric layer 504-1 and a composite metal reflective layer 504-2. In some embodiments, the insulating reflective dielectric layer 504-1 which is also shown in FIG. 4 includes a top insulating dielectric layer 504-11 and a bottom distributed Bragg reflector (DBR) 504-12. In some embodiments, the material of the top insulating dielectric layer 504-11 is metal oxide, and in some instances the material of the top insulating dielectric layer 504-11 further includes Si, In, or/and Sn, and so on. In some embodiments, a multi-layer Bragg mirror (DBR) is used as the bottom DBR 504-12, which is known by those of skilled in the art and is not further described herein. In some embodiments, the top insulating dielectric layer 504-11 can increase the transmittance and the refractive index of light rays, so that the light rays effectively enter into the bottom DBR 504-12. In some embodiments, the top insulating dielectric layer 504-11 includes multiple layers, such as more than or equal to three layers.

Figure 6:
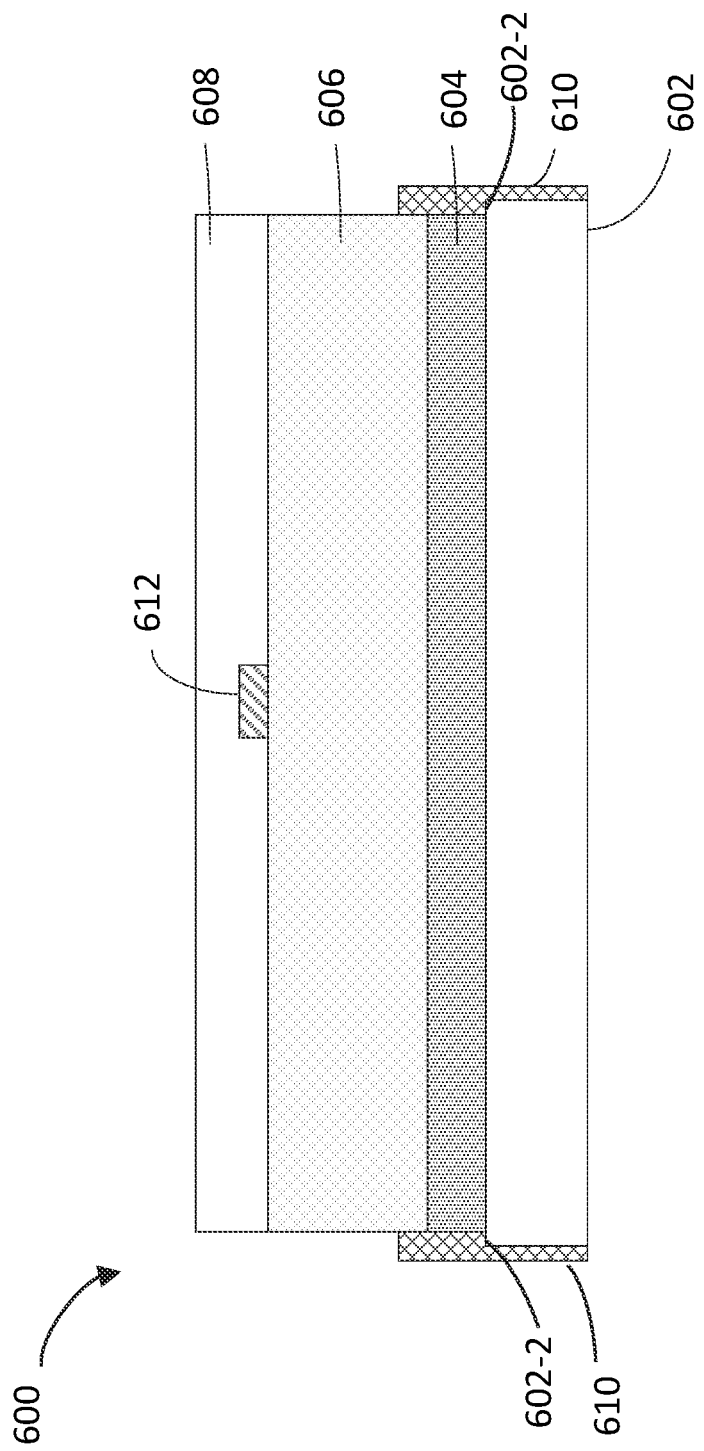
FIG. 6 is a cross-sectional view of a micro LED structure, according to a fourth embodiment.

FIG. 6 is a cross-sectional view of a micro LED structure, according to a fourth embodiment. The micro LED structure 600 illustrated in FIG. 6 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the micro LED structure 600 in FIG. 6 is based on the micro LED structure 300 of FIG. 3. Similar to the micro LED structure 300 in FIG. 3, the micro LED structure 600 includes a bottom conductive layer 602, a light emitting layer 606, a bottom dielectric layer 604, a top conductive structure 608, a conductive side arm 610, and an ohmic contact layer 612 which is much narrower than the light emitting layer 606, so as to form an ohmic contact point. In some embodiments as shown in FIG. 6, the lateral width of the bottom conductive layer 602 is larger than that of the composite reflective layer (bottom dielectric layer 604), so that the bottom conductive layer 602 has a protruded top 602-2 protruding outside. In some embodiments, one end of the conductive side arm 610 is connected to a bottom layer or a bottom portion (not separately shown in FIG. 6) of the light emitting layer 606, and at least part of the other end of the conductive side arm 610 is connected to the protruded top 602-2 of the bottom conductive layer 602. As shown in FIG. 6, part of the bottom of the conductive side arm 610 is supported on the protruded top 602-2 of the bottom conductive layer 602. In some embodiments, to ensure high extractive efficiency of the micro LED structure 600, the lateral width of the bottom conductive layer 602 is less than 2 μm, preferably, is in the range of 0.3~2 μm.

Figure 7:
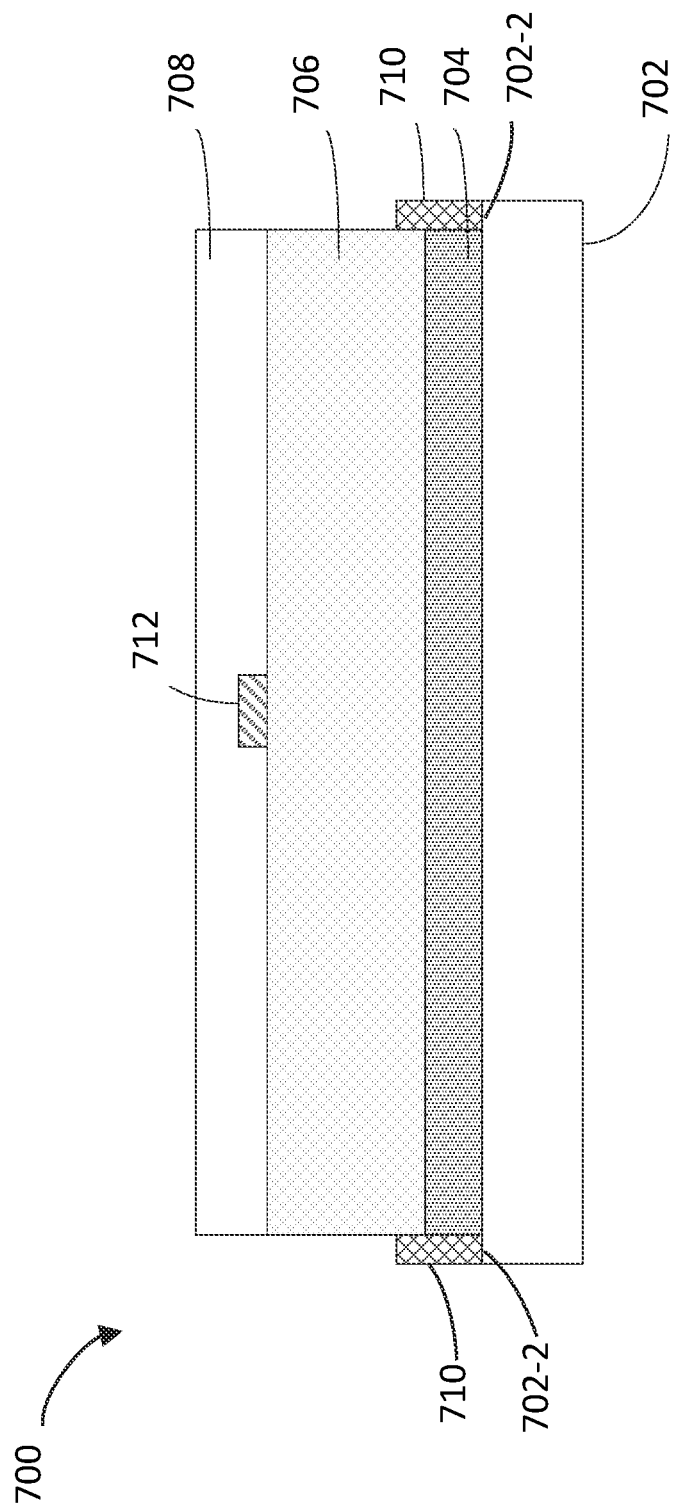
FIG. 7 is a cross-sectional view of a micro LED structure, according to a fifth embodiment.

FIG. 7 is a cross-sectional view of a micro LED structure, according to a fifth embodiment. The micro LED structure 700 illustrated in FIG. 7 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the micro LED structure 700 in FIG. 7 is based on the micro LED structure 600 of FIG. 6. Similar to the micro LED structure 600 in FIG. 6, the micro LED structure 700 includes a bottom conductive layer 702, a light emitting layer 706, a bottom dielectric layer 704, a top conductive structure 708, a conductive side arm 710, and an ohmic contact layer 712 which is much narrower than the light emitting layer 706, so as to form an ohmic contact point. And the lateral width of the bottom conductive layer 702 is larger than that of the composite reflective layer (bottom dielectric layer 704), so that the bottom conductive layer 702 has a protruded top 702-2 protruding outside. In some embodiments, the bottom conductive layer 702 has a protruded top 702-2 which protrudes outside relative to the bottom dielectric layer 704, so that the bottom of the conductive side arm 710 is at least partially or alternatively completely supported on the protruded top 702-2 of the bottom conductive layer 702. In one example, the sidewall of the conductive side arm 710 is aligned with the sidewall of the bottom conductive layer 702 as shown in FIG. 7.

For the embodiments illustrated in FIG. 6 and FIG. 7, in some examples, the lateral width of the bottom dielectric layer 704 is not less than the width of the bottom of the light emitting layer 706, and the sidewall of the light emitting layer 706 is vertical or is inclined. In another example, the lateral width of the bottom dielectric layer 704 can be less than the width of the bottom of the light emitting layer 706, while the shape of the conductive side arm 710 is an L shape.

Figure 8:
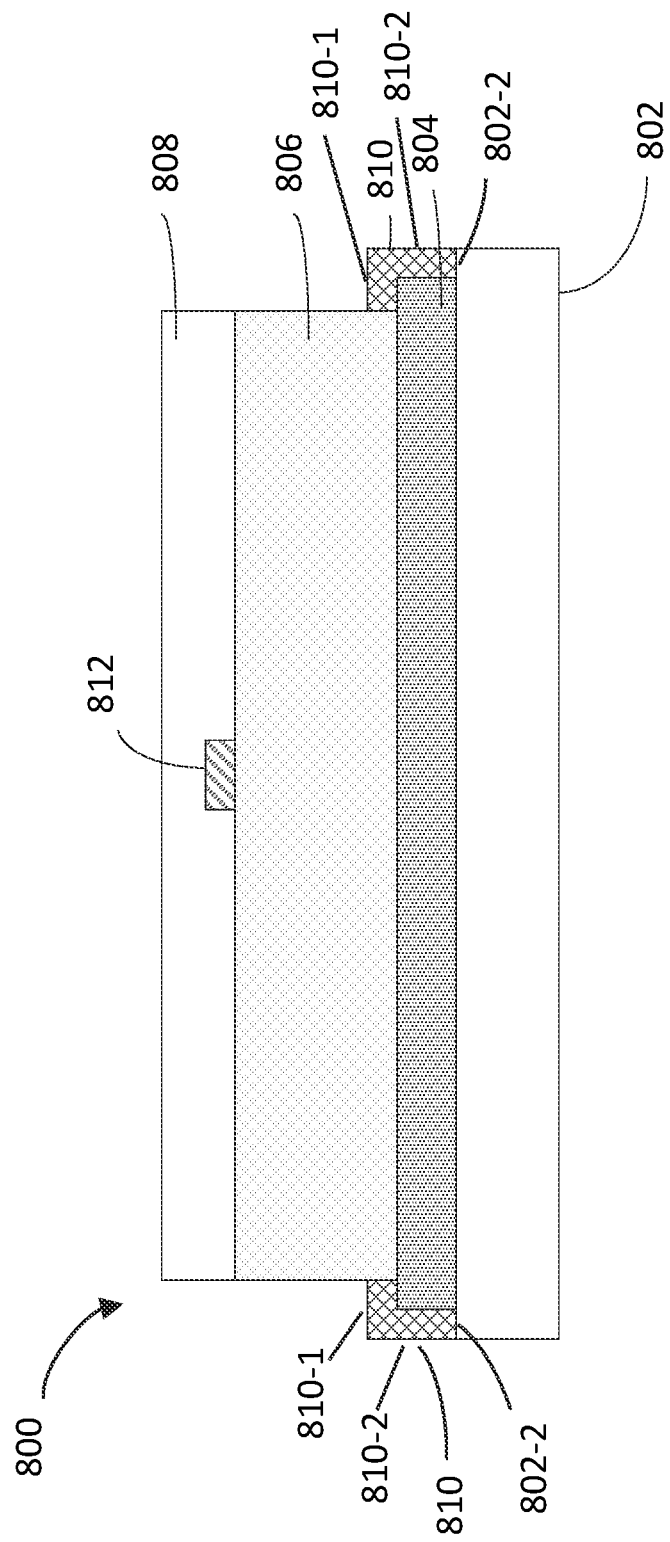
FIG. 8 is a cross-sectional view of a micro LED structure, according to a sixth embodiment.

FIG. 8 is a cross-sectional view of a micro LED structure, according to a sixth embodiment. The micro LED structure 800 illustrated in FIG. 8 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the micro LED structure 800 in FIG. 8 is based on the micro LED structure 700 of FIG. 7. Similar to the micro LED structure 700 in FIG. 7, the micro LED structure 800 includes a bottom conductive layer 802, a light emitting layer 806, a bottom dielectric layer 804, a top conductive structure 808, a conductive side arm 810, and an ohmic contact layer 812 which is much narrower than the light emitting layer 806, so as to form an ohmic contact point. And the lateral width of the bottom conductive layer 802 is larger than that of the composite reflective layer (bottom dielectric layer 804), so that the bottom conductive layer 802 has a protruded top 802-2 protruding outside, and the bottom of the conductive side arm 810 is at least partially or alternatively completely supported on the protruded top 802-2 of the bottom conductive layer 802. In one example, the side wall of the conductive side arm 810 is aligned with the sidewall of the bottom conductive layer 802 as shown in FIG. 8. In some embodiments, the bottom lateral width of the light emitting layer 806 is less than the lateral width of the bottom dielectric layer 804. In some embodiments, the conductive side arm 810 has an inverted L shape. The conductive side arm 810 includes a horizontal part 810-1 and a vertical part 810-2. The end of the horizontal part 810-1 extends to and contacts a bottom layer or a bottom portion (not separately shown in FIG. 8) of the light emitting layer 806, while the end of the vertical part 810-2 extends to and contacts the bottom conductive layer 802.

Figure 9:
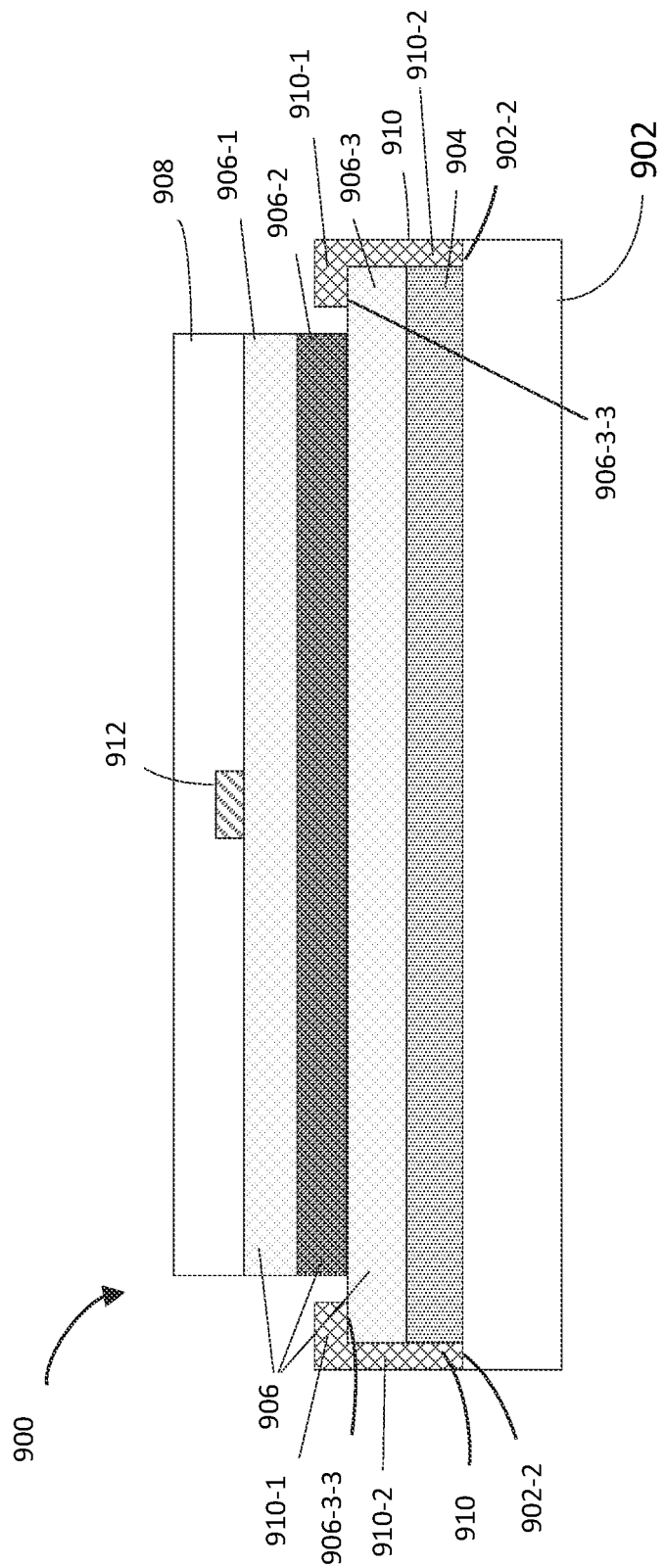
FIG. 9 is a cross-sectional view of a micro LED structure, according to a seventh embodiment.

FIG. 9 is a cross-sectional view of a micro LED structure, according to a seventh embodiment. The micro LED structure 900 illustrated in FIG. 9 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the light extraction efficiency is at least 70%. In some embodiments, the micro LED structure 900 in FIG. 9 is based on the micro LED structure 800 of FIG. 8. Similar to the micro LED structure 800 in FIG. 8, the micro LED structure 900 includes a bottom conductive layer 902, a light emitting layer 906, a bottom dielectric layer 904, a top conductive structure 908, a conductive side arm 910, and an ohmic contact layer 912 which is much narrower than the light emitting layer 906, so as to form an ohmic contact point. Furthermore, the lateral width of the bottom conductive layer 902 is larger than that of the composite reflective layer (bottom dielectric layer 904), so that the bottom conductive layer 902 has a protruded top 902-2 protruding outside, and the bottom of the conductive side arm 910 is at least partially or alternatively completely supported on the protruded top 902-2 of the bottom conductive layer 902. In one example, the side wall of the conductive side arm 910 is aligned with the sidewall of the bottom conductive layer 902 as shown in FIG. 9. In some embodiments, the conductive side arm 910 has an inverted L shape. The conductive side arm 910 includes a horizontal part 910-1 and a vertical part 910-2.

As shown in FIG. 9, in some embodiments, the light emitting layer 906 comprises a first type of semiconductor layer 906-1, an active layer 906-2 and a second type of semiconductor layer 906-3 in turn from the top down. In some embodiments, the second type of semiconductor layer 906-3 has a lateral width that is larger than that of the first type of semiconductor layer 906-1, and that of the active layer 906-2, therefore, forming a protruded top 906-3-3 at the edge of the second type of semiconductor layer 906-3. In some embodiments, the lateral width of the first type of semiconductor layer 906-1 is the same as the lateral width of the active layer 906-2. In some embodiments, the lateral width of the first type of semiconductor layer 906-1 is the same as the lateral width of the top conductive structure 908.

In some embodiments, the end of horizontal part 910-1 of the conductive side arm 910 covers and contacts the protruded top 906-3-3 of the second type of semiconductor layer 906-3 and the other end of the vertical part 910-2 of the conductive side arm 910 contacts the bottom conductive layer 902.

In some embodiments, the first type of semiconductor layer 906-1 is an N type semiconductor layer and the second type of semiconductor layer 906-3 is a P type semiconductor layer. Alternatively, in some embodiments, the first type of semiconductor layer 906-1 is a P type semiconductor layer and the second type of semiconductor layer 906-3 is an N type semiconductor layer. In some embodiments, the material of the N type semiconductor is N type AlInP or N type GaAs, or a composite material of various N type semiconductor layers. In some embodiments, the material of the P type semiconductor layer is P type GaP, or P type AlGaInP.

In some embodiments, the lateral width of the bottom conductive layer 902 is larger than that of the second type of semiconductor layer 906-3. In some embodiments, the lateral width of the second type of semiconductor layer 906-3 is equal to that of the bottom dielectric layer 904. The bottom conductive layer 902 has a protruded top 902-2 that extends outside relative to the second type of semiconductor layer 906-3 and the bottom dielectric layer 904. In some embodiments, at least part of the conductive side arm 910 is at least partially or alternatively completely supported on the protruded top 902-2 of the bottom conductive layer 902. In some embodiments, as shown in FIG. 9, the whole bottom of the conductive side arm 910 is supported on the protruded top 902-2 of the bottom conductive layer 902.

In some embodiments, the end of the conductive side arm 910 which is connected to the protruded top 906-3-3 of the second type of semiconductor layer 906-3 is not directly connected to the active layer 906-2. As shown in FIG. 9, there is a gap between the vertical sidewall of the horizontal part 910-1 of the conductive side arm 910 and the active layer 906-2. In some preferred embodiments, the lateral width of the protruded top 902-2 of the bottom conductive layer 902 (only the width of the portion that is extended outside of the bottom dielectric layer 904) is equal to or less than that of the protruded top 906-3-3 of the second type of semiconductor layer 906-3 (only the width of the portion that is extended outside of the active layer 906-2). That width arrangement ensures that the bottom end of the conductive side arm 910 sits on the bottom conductive layer 902 and avoids the upper end of the conductive side arm 910 contacting the active layer 906-2, so as to form a stable and reliable electrical contact structure.

Figure 10:
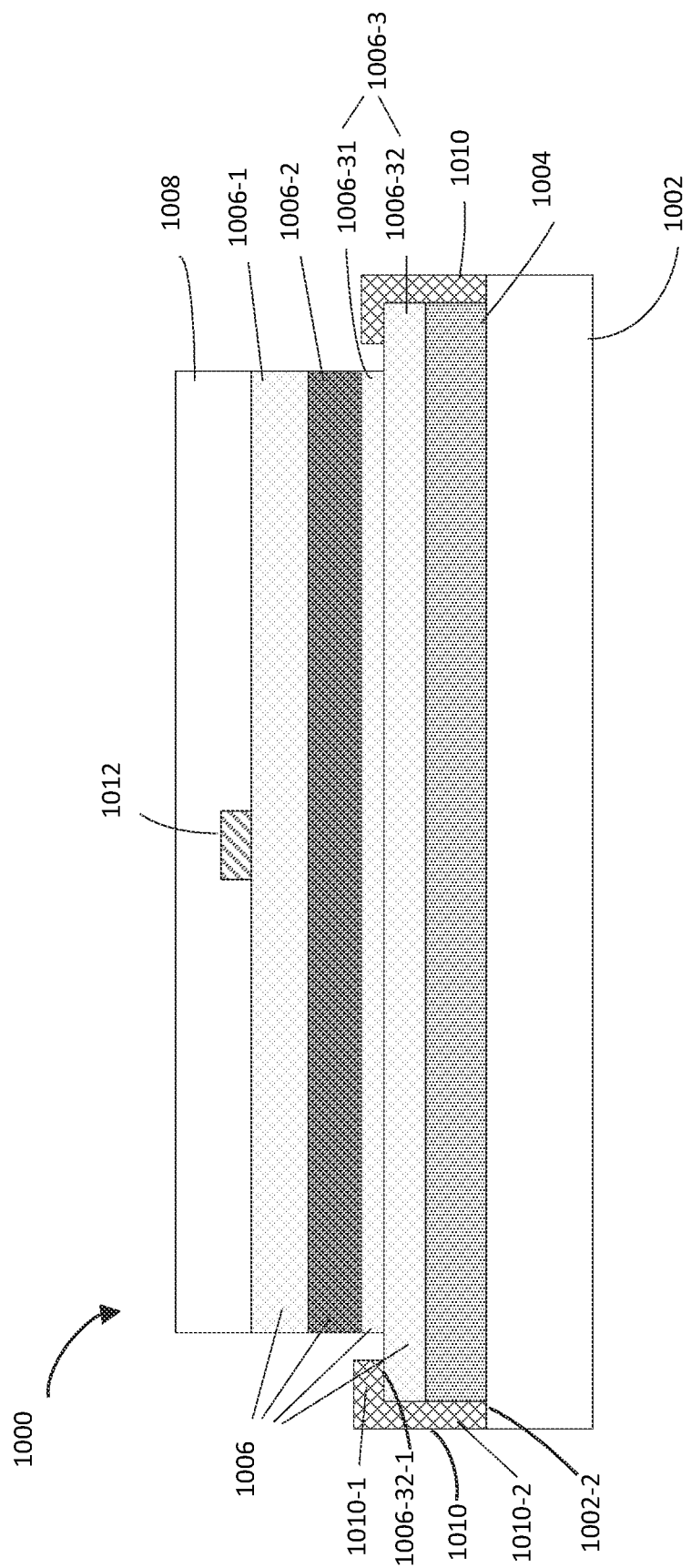
FIG. 10 is a cross-sectional view of a micro LED structure, according to an eighth embodiment.

FIG. 10 is a cross-sectional view of a micro LED structure, according to an eighth embodiment. The micro LED structure 1000 illustrated in FIG. 10 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the light extraction efficiency is at least 70%. In some embodiments, the light extraction efficiency is at least 80%. In some embodiments, the micro LED structure 1000 in FIG. 10 is based on the micro LED structure 900 of FIG. 9. Similar to the micro LED structure 900 in FIG. 9, the micro LED structure 1000 includes a bottom conductive layer 1002, a light emitting layer 1006, a bottom dielectric layer 1004, a top conductive structure 1008, a conductive side arm 1010 with an inverted L shape, and an ohmic contact layer 1012 which is much narrower than the light emitting layer 1006, so as to form an ohmic contact point. In some embodiments, the light emitting layer 1006 comprises a first type of semiconductor layer 1006-1, an active layer 1006-2 and a second type of semiconductor layer 1006-3 from the top down.

As seen in FIG. 10, in some embodiments, the second type of semiconductor layer 1006-3 includes a second type of top semiconductor layer 1006-31 and a second type of bottom semiconductor layer 1006-32. The second type of bottom semiconductor layer 1006-32 extends outside relative to the second type of top semiconductor layer 1006-31, so that the extended part of the second type of bottom semiconductor layer 1006-32 is used as a protruded top 1006-32-1. In some embodiments, the material of the second type of top semiconductor layer 1006-31 and the material of the second type of bottom semiconductor layer 1006-32 can be same or different. In some embodiments, the second type of the top semiconductor layer 1006-31 is AlGaInP, and the second type of the bottom semiconductor layer 1006-32 is GaP. Additionally, in some embodiments, the first type of semiconductor layer 1006-1 has one layer or multiple layers.

For example, the first type of semiconductor layer 1006-1 includes N type AlInP and N type GaAs from the top down. In another example, the first type of semiconductor layer 1006-1 only has N type AlInP. In some embodiments, the N type AlInP is directly beneath and in contact with the ohmic contact layer 1012 and the top conductive structure 1008. In one preferred embodiment, the light emitting layer 1006 includes N type AlInP, a quantum active layer, P type AlGaInP and P type GaP in turn from the top down.

As illustrated in FIG. 10, in some embodiments, the horizontal part 1010-1 of the conductive side arm 1010 covers and is in direct contact with the second type of bottom semiconductor layer 1006-32 and the end of the horizontal part 1010-1 is not directly connected to the second type of top semiconductor layer 1006-31, the active layer 1006-2 and/or the first type of semiconductor layer 1006-1. In some embodiments, the lateral width of the bottom conductive layer 1002 is larger than that of the bottom dielectric layer 1004. In some embodiments, the sidewall of the bottom conductive layer 1002 protrudes outside from the sidewall of the conductive side arm 1010 (not shown in FIG. 10). In some embodiments, the material of the conductive side arm 1010 is conductive metal or another conductive material.

Similar to FIGS. 1 to 9, in some embodiments, there are two conductive side arms 1010 on each side of the micro LED structure 1000 in FIG. 10. Furthermore, similar to FIGS. 1 to 9, in some embodiments, the conductive side arm 1010 can be attached to and contact the sidewall of the bottom dielectric layer 1004 in FIG. 10. In an alternative to embodiment, the shape of the conductive side arm 1010 can be changed into another shape without contacting the sidewall of the bottom dielectric layer 1004 (not shown in FIG. 10), and the equivalent embodiments or variations may be implemented by a person skilled in the art.

Figure 11:
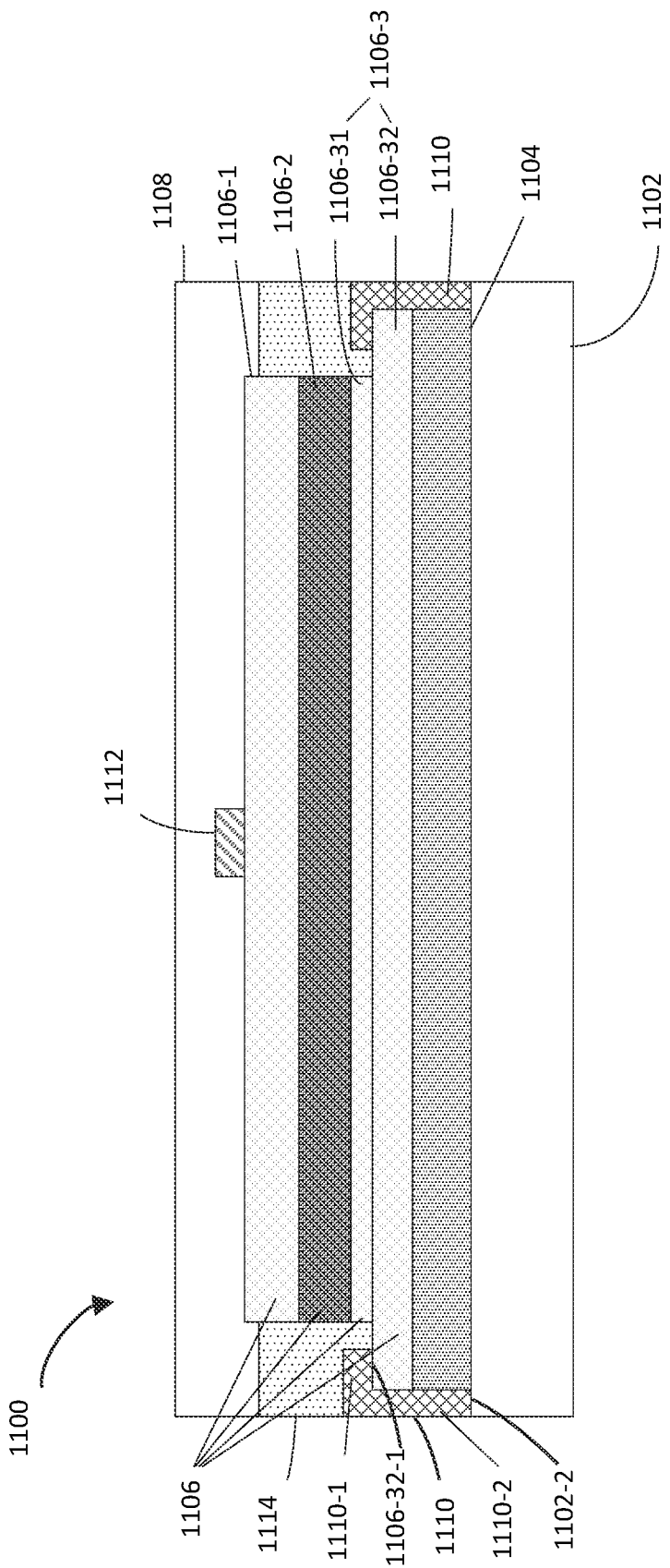
FIG. 11 is a cross-sectional view of a micro LED structure, according to a ninth embodiment.

FIG. 11 is a cross-sectional view of a micro LED structure, according to a ninth embodiment. The micro LED structure 1100 illustrated in FIG. 11 has a high light extraction efficiency. In some embodiments, the light extraction efficiency is at least 20%. In some embodiments, the light extraction efficiency is at least 30%. In some embodiments, the light extraction efficiency is at least 40%. In some embodiments, the light extraction efficiency is at least 50%. In some embodiments, the light extraction efficiency is at least 60%. In some embodiments, the light extraction efficiency is at least 70%. In some embodiments, the light extraction efficiency is at least 80%. In some embodiments, the light extraction efficiency is at least 90%. In some embodiments, the micro LED structure 1100 in FIG. 11 is based on the micro LED structure 1000 of FIG. 10. Similar to the micro LED structure 1000 in FIG. 10, the micro LED structure 1100 includes a bottom conductive layer 1102, a light emitting layer 1106, a bottom dielectric layer 1104, a top conductive structure 1108, a conductive side arm 1110 with an inverted L shape, and an ohmic contact layer 1112 which is much narrower than the light emitting layer 1106, so as to form an ohmic contact point. In some embodiments, the light emitting layer 1106 comprises a first type of semiconductor layer 1106-1, an active layer 1106-2 and a second type of semiconductor layer 1106-3 from the top down. In some embodiments, the second type of semiconductor layer 1106-3 includes a second type of top semiconductor layer 1106-31 and a second type of bottom semiconductor layer 1106-32.

According to FIG. 11, the micro LED structure 1100 with a high light extraction efficiency further includes a transparent isolation layer 1114. In some embodiments, there are two transparent isolation layers 1114 on each side of the micro LED structure 1100. In some embodiments, the transparent isolation layer 1114 at least directly covers a portion within the gap, or alternatively, all the gap between the conductive side arm 1110 and the side wall of the light emitting layer 1106 of the protruded top 1106-32-1 of the second type of bottom semiconductor layer 1106-32. The transparent isolation layer 1114 also covers directly the exposed sidewall of the second type of top semiconductor layer 1106-31, the top and the side wall toward the micro LED structure 1100 of the conductive side arm 1110, the sidewall of the active layer 1106-2, and at least a substantial portion of the sidewall from the bottom up of the first type of semiconductor layer 1106-1. In some embodiments, the substantial portion of the sidewall from the bottom up of the first type of semiconductor layer 1106-1 is at least 50% of the sidewall. In some embodiments, the substantial portion of the sidewall from the bottom up of the first type of semiconductor layer 1106-1 is at least 70% of the sidewall. In some embodiments, the substantial portion of the sidewall from the bottom up of the first type of semiconductor layer 1106-1 is at least 90% of the sidewall.

In some embodiments, the top conductive structure 1108 is arranged on the sidewall and the top of the ohmic contact layer 1112, the protruded top of the first type of semiconductor layer 1106-1, and the top of the transparent isolation layer 1114. In some embodiments, the top of the transparent isolation layer 1114 at least covers the part of the top of the first type of semiconductor layer 1106-1 (not shown in FIG. 11) and not covers the top of the ohmic contact layer 1112.

In some embodiments, the material of the bottom conductive layer 1102 includes one or more types of conductive metal, such as Cr, Pt, Au, Sn and so on. A multi-layer composite conductive layer used as the bottom conductive layer 1102 is made by those metals. In some embodiments, the bottom conductive layer 1102 is further used as a bonding layer to be bonded on the surface of an electric circuit base 1116 (not shown in FIG. 11), so as to electrically connect the light emitting layer 1106 with the electric circuit base 1116. The electric circuit base 1116 at least includes a driving circuit, which controls the light emission of the light emitting layer 1106.

In some embodiments, the bottom of the conductive side arm 1110 extends downward but is not in contact with the electric circuit base 1116. In some embodiments, when the bottom of the conductive side arm 1110 extends downward to contact the electric circuit base 1116, the contact electrode in the electric circuit base 1116 is connected to the bottom of the conductive side arm 1110, and the other area not in contact with the contact electrode beneath the bottom of the conductive side arm 1110 is insulated. In some embodiments, the bottom of the conductive side arm 1110 is also bonded on the surface of the electric circuit base 1116.

As described above in FIGS. 1 to 11, in the LED structures which have a high light extraction efficiency disclosed herein, the light emitting layer uses the bottom conductive layer to achieve a downward electrical contact and uses the top conductive structure to achieve an upward electrical contact. Furthermore, the conductive side arm electrically connects the sidewall of the light emitting layer with both sides of the bottom conductive layer. When the bottom of the conductive side arm extends downward to contact the electric circuit base, the conductive side arm further electrically connects the light emitting layer with the electric circuit base, which increases the light emergent area and improves the light extraction efficiency.

Additionally, the reflective area of the composite reflective layer (bottom dielectric layer) is enlarged by using the conductive side arm electrically connecting the sidewall of the light emitting layer and the bottom conductive layer, which further improves the light extraction efficiency of the LED.

Furthermore, the ohmic contact layer formed between the top conductive structure and the light emitting layer can be made very small and thin, such as a transparent metal film. That structure ensures a good ohmic contact between the light emitting layer and the top conductive structure, which increases the light emergent area and also improves the light extraction efficiency.

Although the detailed description contains many specifics, these should not be construed as limiting the scope of the invention but merely as illustrating different examples and aspects of the invention. It should be appreciated that the scope of the invention includes other embodiments not discussed in detail above. For example, micro LED structures and layers with different shapes and thicknesses may also be used, such as square base or other polygon base. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

Further embodiments also include various subsets of the above embodiments including embodiments shown in FIGS. 1 to 11 combined or otherwise re-arranged in various other embodiments.

Figure 12:
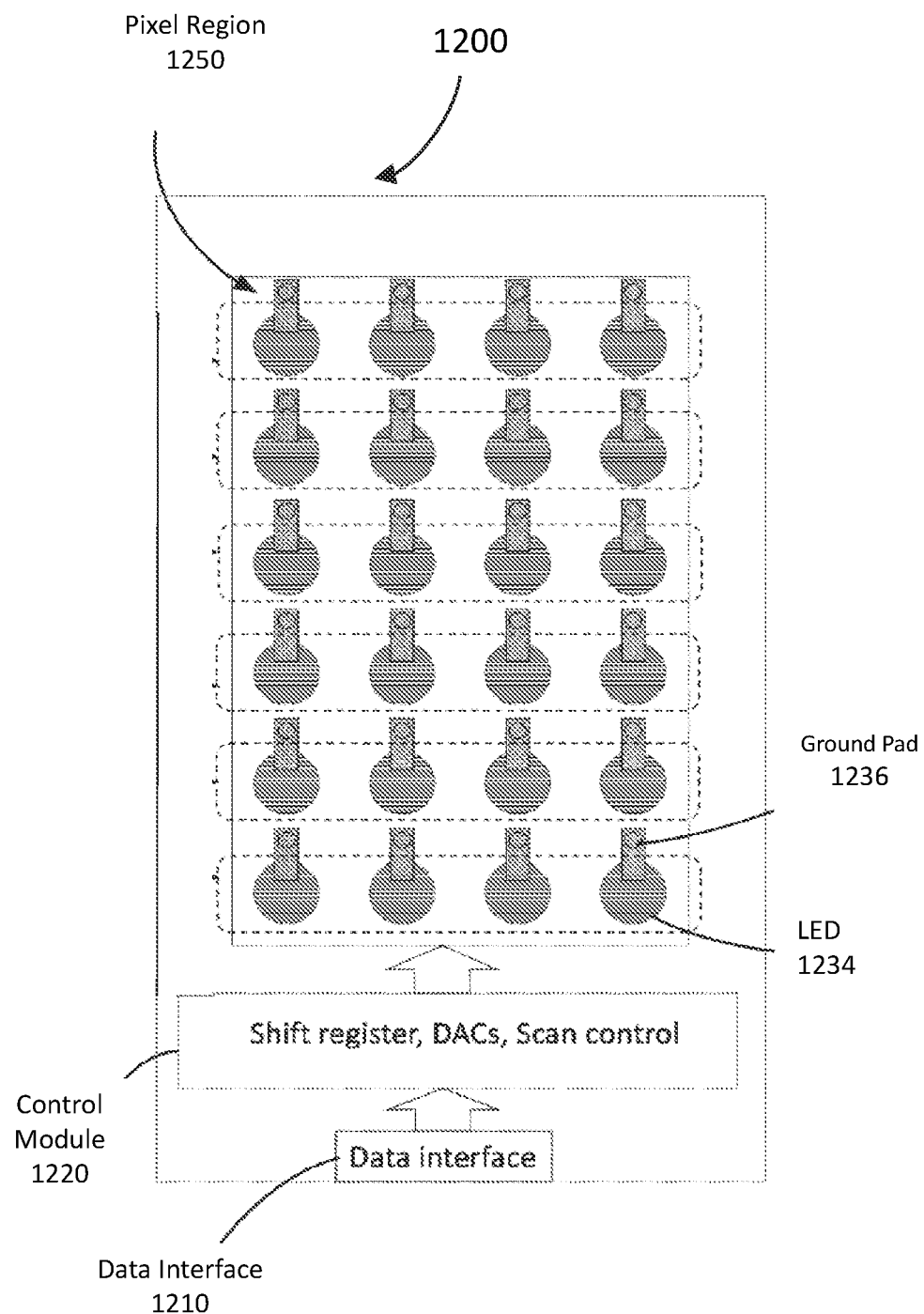
FIG. 12 is a top view of a micro LED display panel 1200, in accordance with some embodiments.

FIG. 12 is a top view of a micro LED display panel 1200, in accordance with some embodiments. The display panel 1200 includes a data interface 1210, a control module 1220 and a pixel region 1250. The data interface 1210 receives data defining the image to be displayed. The source(s) and format of this data will vary depending on the application. The control module 1220 receives the incoming data and converts it to a form suitable to drive the pixels in the display panel. The control module 1220 may include digital logic and/or state machines to convert from the received format to one appropriate for the pixel region 1250, shift registers or other types of buffers and memory to store and transfer the data, digital-to-analog converters and level shifters, and scan controllers including clocking circuitry.

The pixel region 1250 includes an array of pixels. The pixels include micro LEDs, such as the micro LED 1234 with structures described in FIGS. 1-11, integrated with pixel drivers in some examples. In this example, the display panel 1200 is a color RGB display panel. It includes red, green and blue pixels. Within each pixel, the LED 1234 is controlled by a pixel driver. The pixel makes contact to a supply voltage (not shown) and ground via a ground pad 1236, and also to a control signal, according to some embodiments. Although not shown in FIG. 12, the p-electrode of the LED 1234 and the output of the driving transistor are electrically connected. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments.

FIG. 12 is merely a representative figure. Other designs will be apparent. For example, the colors do not have to be red, green and blue. They also do not have to be arranged in columns or stripes. As one example, apart from the arrangement of a square matrix of pixels shown in FIG. 12, an arrangement of hexagonal matrix of pixels can also be used to form the display panel 1200.

In some applications, a fully programmable rectangular array of pixels is not necessary. Other designs of display panels with a variety of shapes and displays may also be formed using the device structures described herein. One class of examples is specialty applications, including signage and automotive applications. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Example applications include display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including embodiments as shown in FIGS. 1 to 12 combined or otherwise re-arranged in various other embodiments.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs and OLEDs with control circuitry other than pixel drivers. Examples of non-LED devices include vertical cavity surface emitting lasers (VC-SEL), photodetectors, micro-electro-mechanical system (MEMS), silicon photonic devices, power electronic devices, and distributed feedback lasers (DFB). Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements or steps, these elements or steps should not be limited by these terms. These terms are only used to distinguish one element or step from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A micro light emitting diode having a high light extraction efficiency comprising:
   a bottom conductive layer;
   a light emitting layer on the bottom conductive layer;

a top conductive structure on the light emitting layer;
a bottom dielectric layer positioned between the bottom conductive layer and the light emitting layer; and
a conductive side arm connecting a sidewall of a bottom layer of the light emitting layer and the bottom conductive layer, wherein:
the light emitting layer further comprises a first type of semiconductor layer, an active layer, and a second type of semiconductor layer in turn from top down;
the second type of semiconductor layer has a protruded top extending outside of the active layer and the first type of semiconductor layer;
a first end of the conductive side arm covers and contacts the protruded top of the second type of semiconductor layer, and a second end of the conductive side arm contacts the bottom conductive layer;
a lateral width of the bottom conductive layer is larger than a lateral width of the second type of semiconductor layer; and
a sidewall of the conductive side arm is aligned with a sidewall of the bottom conductive layer.

2. The micro light emitting diode according to claim 1, further comprising an ohmic contact layer positioned between the top conductive structure and the light emitting layer.

3. The micro light emitting diode according to claim 1, wherein:
the lateral width of the bottom conductive layer is larger than a lateral width of the bottom dielectric layer, so that the bottom conductive layer has a protruded top extending outside of the second type of semiconductor layer and the bottom dielectric layer; and
at least part of the conductive side arm is supported on the protruded top of the bottom conductive layer.

4. The micro light emitting diode according to claim 3, wherein the lateral width of the bottom conductive layer is less than 2 μm.

5. The micro light emitting diode according to claim 3, wherein a width of the protruded top of the bottom conductive layer is less than or equal to a width of the protruded top of the second type of semiconductor layer.

6. The micro light emitting diode according to claim 1, wherein a material of the second type of top semiconductor layer is different from a material of the second type of bottom semiconductor layer.

7. The micro light emitting diode according to claim 1, wherein:
the second type of top semiconductor layer is AlGaInP;
the second type of bottom semiconductor layer is GaP; and
the first type of semiconductor layer is AlInP.

8. The micro light emitting diode according to claim 1, wherein:
the first end of the conductive side arm is in electrical contact with the protruded top of the second type of bottom semiconductor layer;
the first end of the conductive side arm is not in electrical contact with the second type of top semiconductor layer; and
the first end of the conductive side arm is not in electrical contact with the light emitting layer and the first type of semiconductor layer.

9. The micro light emitting diode according to claim 1, wherein a lateral width of the first type of semiconductor layer is equal to or larger than a lateral width of the active layer.

10. The micro light emitting diode according to claim 1, wherein a lateral width of the first type of semiconductor layer is much narrower than a lateral width of the active layer.

11. The micro light emitting diode according to claim 1, wherein the conductive side arm has an inverted L shape.

12. The micro light emitting diode according to claim 1, wherein the conductive side arm is attached and connected to a sidewall of the bottom dielectric layer.

13. The micro light emitting diode according to claim 1, wherein:
the lateral width of the bottom conductive layer is larger than a lateral width of the bottom dielectric layer; and
a sidewall of the bottom conductive layer protrudes outside and beyond a sidewall of the conductive side arm.

14. The micro light emitting diode according to claim 1, further comprising a transparent isolation layer, wherein:
the transparent isolation layer covers the protruded top of the second type of semiconductor layer, a top and a side wall of the conductive side arm, a sidewall of the light emitting layer, and a sidewall of the first type of semiconductor layer; and
the top conductive structure is positioned on top of the transparent isolation layer.

15. The micro light emitting diode according to claim 1, wherein the first type of semiconductor layer is an N type semiconductor layer and the second type of semiconductor layer is a P type semiconductor layer.

16. The micro light emitting diode according to claim 1, wherein the first type of semiconductor layer is a P type semiconductor layer and the second type of semiconductor layer is an N type semiconductor layer.

17. The micro light emitting diode according to claim 1, further comprising an electric circuit base at a bottom of the bottom conductive layer, wherein:
the bottom conductive layer is used as a bonding layer that is bonded with a surface of the electric circuit base; and
the electric circuit base comprises a driving circuit that controls emission of the light emitting layer.

18. The micro light emitting diode according to claim 1, wherein the micro light emitting diode has a light extraction efficiency of at least 40%.

19. The micro light emitting diode according to claim 1, wherein the micro light emitting diode has a light extraction efficiency of at least 60%.

20. The micro light emitting diode according to claim 1, wherein:
the second type of semiconductive layer further comprises a second type of top semiconductor layer and a second type of bottom semiconductor layer; and
the second type of bottom semiconductor layer extends outside relative to the second type of top semiconductor layer, thereby forming the protruded top extending outside of the active layer and the first type of semiconductor layer.

* * * * *